United States Patent
Gerbsch

(10) Patent No.: US 7,834,448 B2
(45) Date of Patent: Nov. 16, 2010

(54) FLUID COOLED SEMICONDUCTOR POWER MODULE HAVING DOUBLE-SIDED COOLING

(75) Inventor: Erich W. Gerbsch, Cicero, IN (US)

(73) Assignee: Delphi Technologies, Inc., Troy, MI (US)

( * ) Notice: Subject to any disclaimer, the term of this patent is extended or adjusted under 35 U.S.C. 154(b) by 429 days.

(21) Appl. No.: 11/899,352

(22) Filed: Sep. 5, 2007

(65) Prior Publication Data

US 2009/0057882 A1 Mar. 5, 2009

(51) Int. Cl.
*H01L 23/34* (2006.01)

(52) U.S. Cl. .............................. 257/714; 257/E23.097; 257/E23.098; 257/E23.104; 361/689; 361/699

(58) Field of Classification Search .................. 257/714, 257/717, E23.08, E23.104, E23.098, E23.097; 361/689, 699
See application file for complete search history.

(56) References Cited

U.S. PATENT DOCUMENTS

| | | | | |
|---|---|---|---|---|
| 4,288,841 A | * | 9/1981 | Gogal | 361/792 |
| 5,436,501 A | * | 7/1995 | Ikeda | 257/714 |
| 5,666,269 A | * | 9/1997 | Romero et al. | 361/699 |
| 5,978,220 A | * | 11/1999 | Frey et al. | 361/699 |
| 6,542,365 B2 | * | 4/2003 | Inoue | 361/699 |
| 6,639,798 B1 | | 10/2003 | Jeter et al. | |

* cited by examiner

*Primary Examiner*—Thao X Le
*Assistant Examiner*—Robert Huber
(74) *Attorney, Agent, or Firm*—Jimmy L. Funke

(57) ABSTRACT

A semiconductor power module includes one or more power semiconductor power devices sandwiched between a fluid conducting base and a fluid conducting cover joined to the base. Fluid coolant entering the base diverges into a first flow path through the base and a second parallel flow path through the cover, and then converges and discharges through an outlet. The semiconductor devices have upper and lower active areas that are thermally coupled to inboard faces of the cover and base for low double-sided thermal resistance, and the devices are electrically accessed through a set of terminals formed on the base. Multiple sets of semiconductor power devices are double-side cooled by joining multiple fluid conducting covers to the base such that the coolant successively diverges and then re-converges at the locations where each cover is joined to the base. Preferably, the flow paths in both the base and cover include integral features for enhancing the surface area in contact with the coolant.

14 Claims, 14 Drawing Sheets

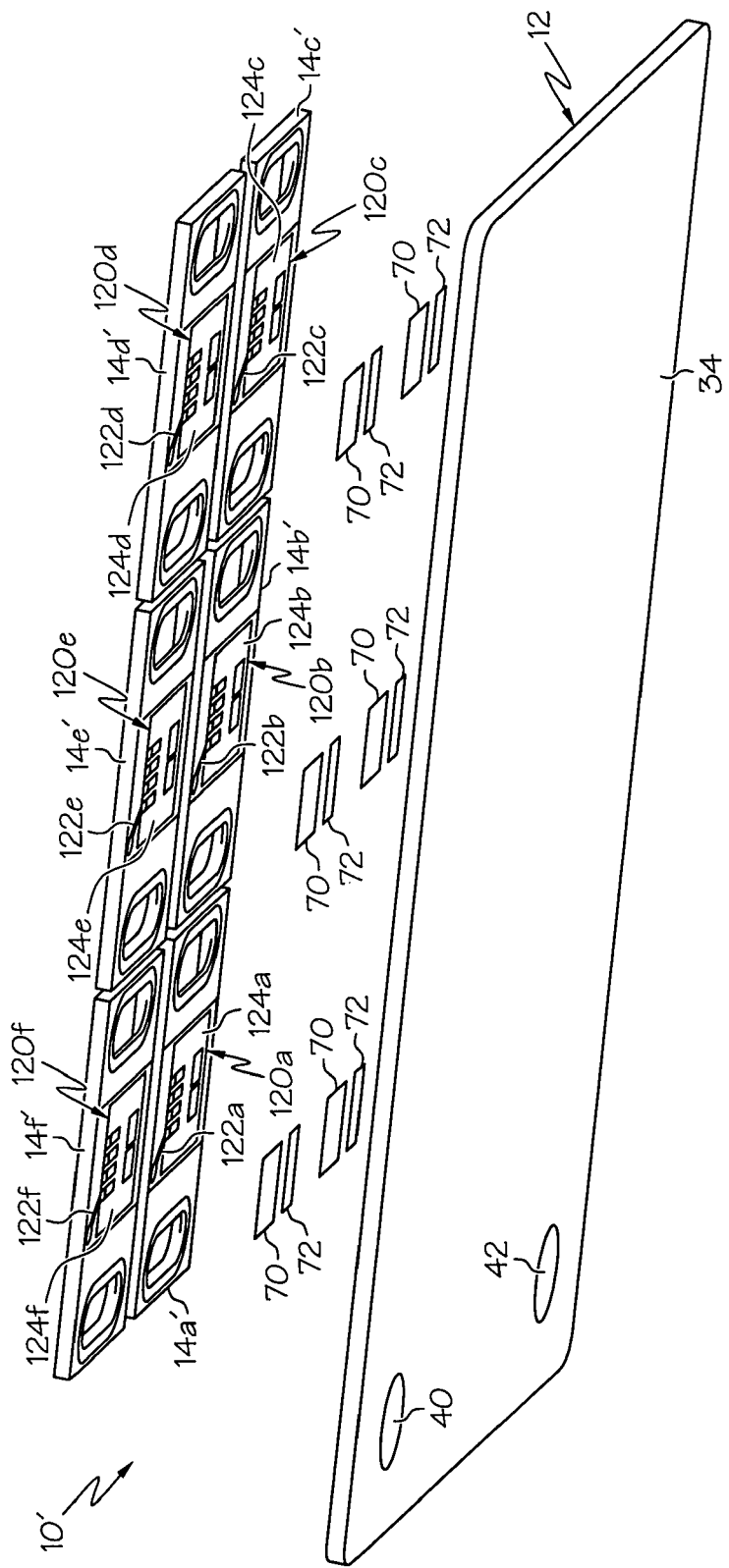

FLUID COOLED SEMICONDUCTOR POWER MODULE HAVING DOUBLE-SIDED COOLING

TECHNICAL FIELD

The present invention relates to a semiconductor power module with integral passages through which liquid coolant is conducted to dissipate heat generated by the module.

BACKGROUND OF THE INVENTION

Various types of cooling mechanisms can be used to remove waste heat from high power semiconductor devices such as power FETs and IGBTs. In cases where the waste heat and/or the ambient temperature are very high, the power device packages can be thermally coupled to a liquid cooled heat exchanger. For example, the U.S. Pat. No. 6,639,798 to Jeter et al. illustrates an electronics assembly including a liquid cooled heat exchanger having an internal fin structure for increasing the effective surface area for heat exchange. Nevertheless, the thermal resistance between the power device package and the heat exchanger can significantly limit the heat transfer capability of the assembly. Furthermore, only one side of the power device package can be thermally coupled to the heat exchanger in most cases. Accordingly, what is desired is a liquid cooled packaging arrangement for power semiconductor devices that maximizes thermal coupling between the power devices and the liquid coolant and provides double-sided cooling of the power device packages.

SUMMARY OF THE INVENTION

The present invention is directed to an improved semiconductor power module including one or more power semiconductor power devices and an integral fluid passage for providing double-sided fluid cooling of the semiconductor devices. One or more semiconductor power devices are sandwiched between a fluid conducting base and a fluid conducting cover joined to the base, where fluid coolant entering an inlet port of the base diverges into a first flow path through the base and a second parallel flow path through the cover, and then converges and discharges through an outlet port of the base. The semiconductor devices have upper and lower active areas that are thermally coupled to inboard faces of the cover and base for low double-sided thermal resistance, and the devices are electrically accessed through a set of terminals formed on the base. Multiple sets of semiconductor power devices are double-side cooled by joining multiple fluid conducting covers to the base such that the coolant successively diverges and then re-converges at the locations where each cover is joined to the base. Preferably, the flow paths in both the base and cover include integral features for enhancing the surface area in contact with the coolant.

BRIEF DESCRIPTION OF THE DRAWINGS

FIG. 5A is an isometric view of a backplate of the base, from an outboard point of reference; FIG. 5B is an isometric view of the backplate of FIG. 5A from an inboard point of reference, including ceramic substrates; FIG. 5C is an isometric view of the backplate of FIG. 5A, following the installation of an outer sheet metal panel; FIG. 5D is an isometric view of the backplate of FIG. 5C, following the fabrication of circuit paths on the ceramic substrates; and FIG. 5E is an isometric view of the completed base.

FIG. 6A is an isometric view of the cover, from an outboard point of reference; and FIG. 6B is an isometric view of the cover, from an inboard point of reference.

FIG. 9 is an exploded lower isometric view of the semiconductor power module of FIG. 8.

DESCRIPTION OF THE PREFERRED EMBODIMENT

Figure 1:
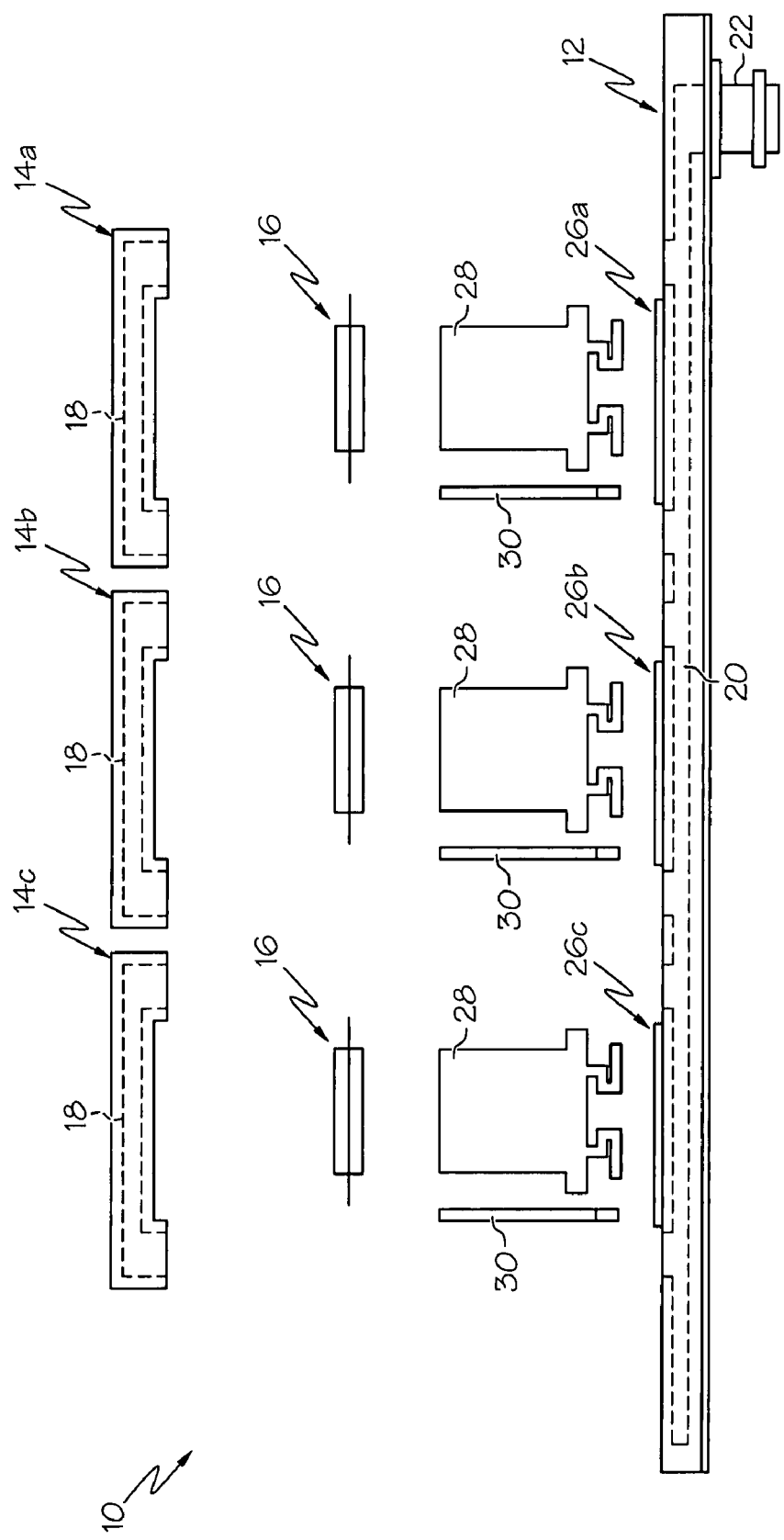
FIG. 1 is an exploded side view of a semiconductor power module according to a first embodiment of this invention.

The present invention is directed to a power electronics module for double-side liquid cooling of power semiconductor chips such as transistors and diodes that have solderable active areas (referred to herein as electrodes) on their opposing faces. For example, an insulated gate bipolar power transistor, or IGBT, typically has a solderable collector electrode formed on one of its faces and solderable gate and emitter electrodes formed on its opposite face. In a first embodiment of the invention, illustrated in FIGS. 1-7, the semiconductor chips are pre-assembled with a flexible circuit leadframe and ceramic substrate to form chip assemblies that are installed into the power electronics module. In a second embodiment of the invention, illustrated in FIGS. 8-9, the semiconductor chips are individually mounted in the power electronics module, and the leadframe elements are integrated into the module itself. Both embodiments are disclosed in the context of a power electronics module such as a three-phase inverter that comprises six gated semiconductor switches, each switch including a transistor such as an IGBT or FET and a free-wheeling or anti-parallel diode. However, it will be appreciated that the disclosed apparatus is applicable in general to power electronics modules including more or fewer power semiconductor devices.

Referring to the drawings, and particularly to FIGS. 1-4, the reference numeral 10 generally designates a semiconductor power module according to a first embodiment of this invention. The module 10 includes a base 12, six covers 14a, 14b, 14c, 14d, 14e, 14f, six semiconductor chip assemblies 16 sandwiched between the base 12 and the covers 14a-14f, and a set of power and gate terminals 28 and 30. As described below in reference to FIG. 7, each semiconductor chip assembly 16 includes a transistor chip 70, a diode chip 72, a flexible circuit leadframe 74, a first ceramic substrate 76 for the transistor chip 70, and a second ceramic substrate 78 for the diode chip 72.

The covers 14a-14f are identical, and each includes an integral fluid conducting passage 18 as shown in FIG. 1 with respect to the illustrated covers 14a-14c. Base 12 also includes an integral fluid conducting passage 20, and the cover passages 18 are joined at each end to the base passages 20 to allow fluid circulation through both the base 12 and the covers 14a-14f. Referring to the illustration of FIG. 4, coolant fluid (liquid or gaseous) is supplied to the base passage 20 through an inlet fluid coupling 22, and the flow diverges between base passage 20 and the fluid passage 18 of cover 14a. The fluid paths converge at the downstream end of cover 14a, and then diverge again between base passage 20 and the fluid passage 18 of cover 14b. The fluid successively diverges and converges at each of the covers 14a-14f, and then exhausts through an outlet fluid coupling 24 (not shown in FIGS. 1-3). This routing of coolant through both the base 12 and covers 14a-14f provides double-sided cooling of the semiconductor chip assemblies 16 since each is thermally coupled to both the base 12 and a respective cover 14a-14f.

Figure 2:
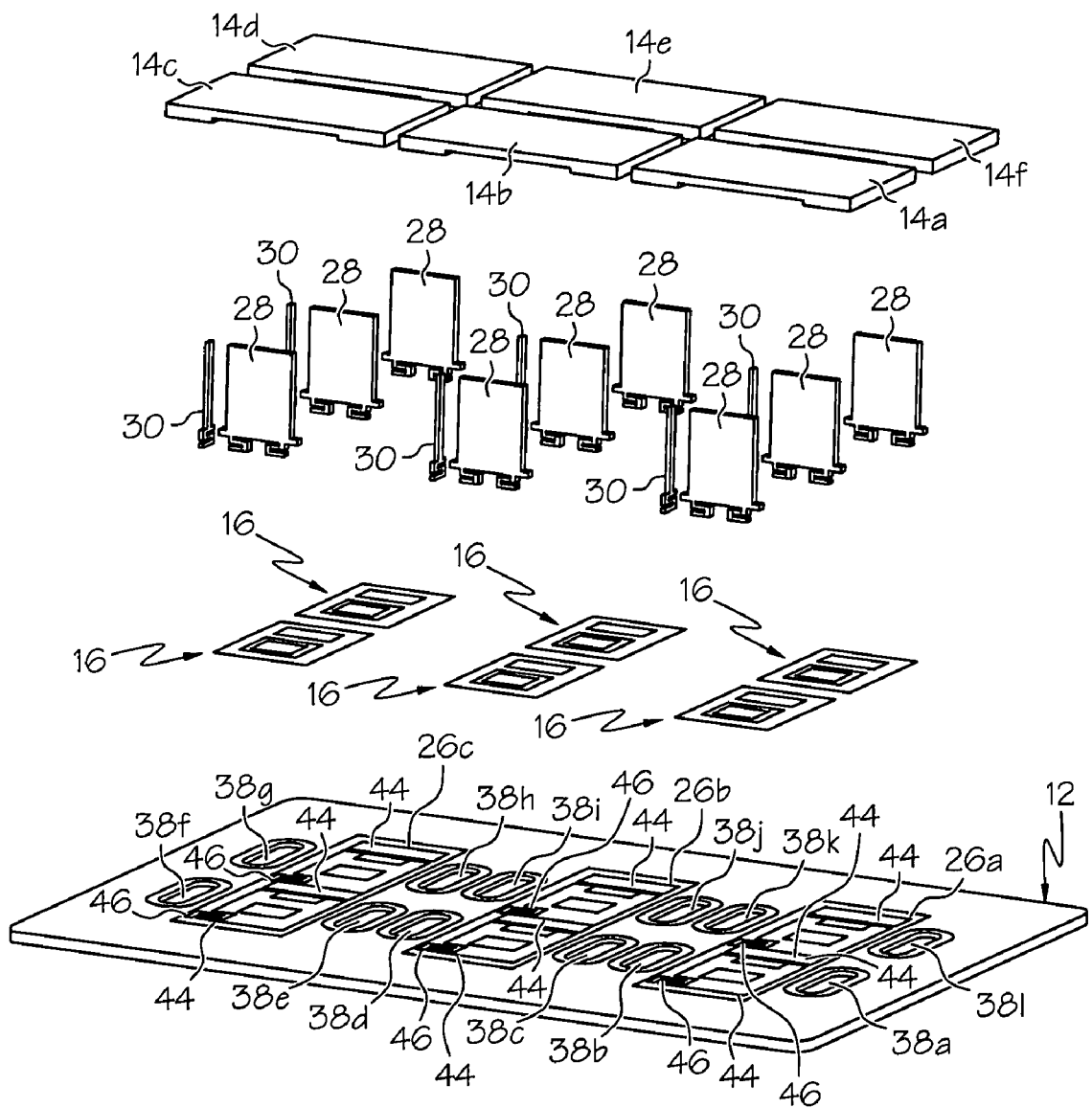
FIG. 2 is an exploded isometric view of the semiconductor power module of FIG. 1.
Figure 3:
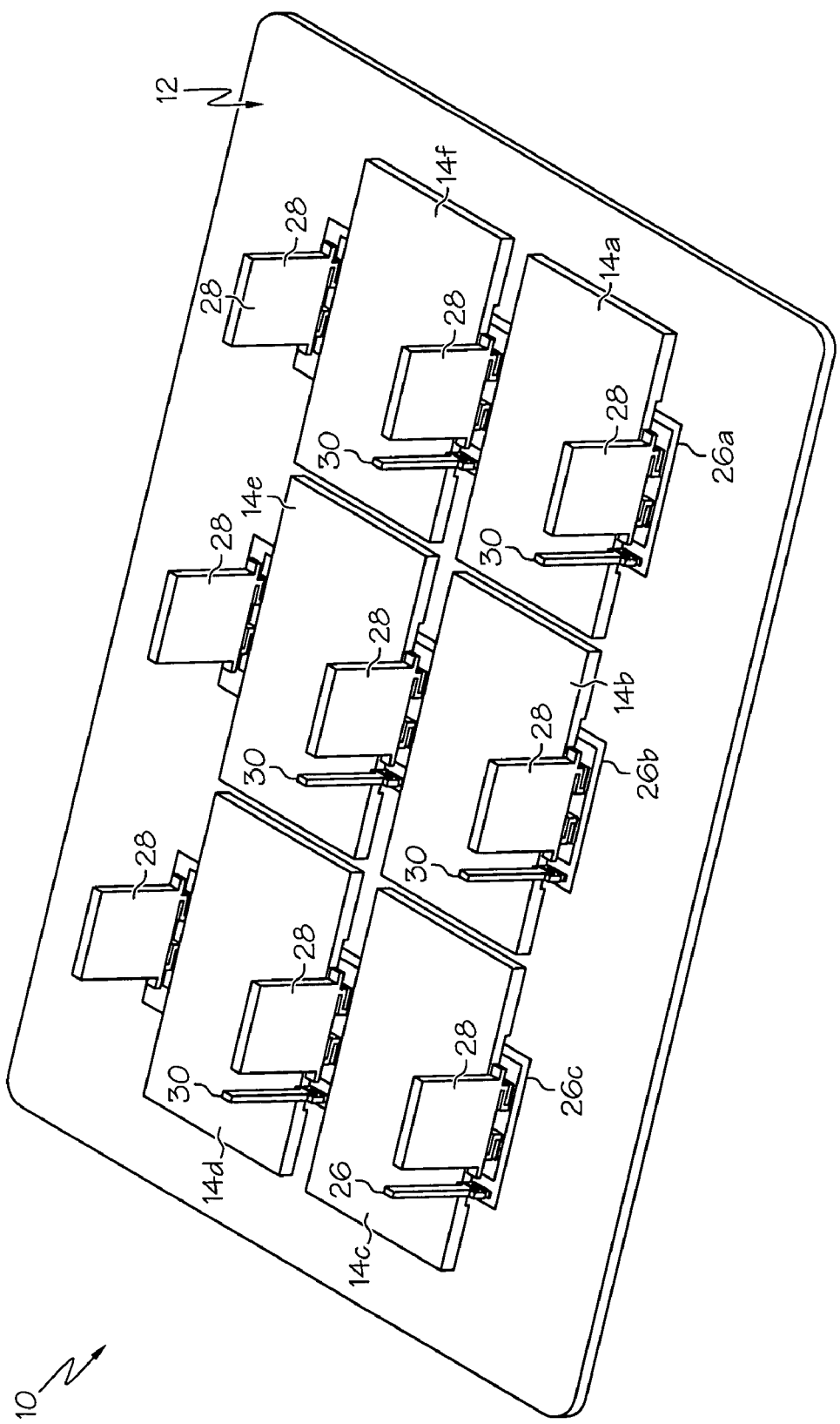
FIG. 3 is a fully assembled isometric view of the semiconductor power module of FIGS. 1-2.

Referring to FIG. 2, three separate ceramic substrates 26a, 26b, 26c are mounted on the inboard face of base 12, and circuit traces are formed on the substrates 26a-26c for interfacing with the semiconductor chip assemblies 16, power terminals 28 and gate terminals 30. In the illustrated embodiment, two semiconductor chip assemblies 16, three power terminals 28 and two gate terminals 30 are mounted on each ceramic substrate 26a-26c. The covers 14a-14f are mounted on the base 12 atop the semiconductor chip assemblies 16, and the terminals 28, 30 are mounted on solderable areas 44, 46 adjacent the covers 14a-14f to provide access to the electrical terminals of the respective semiconductor chips 70 and 72.

Figure 5A:
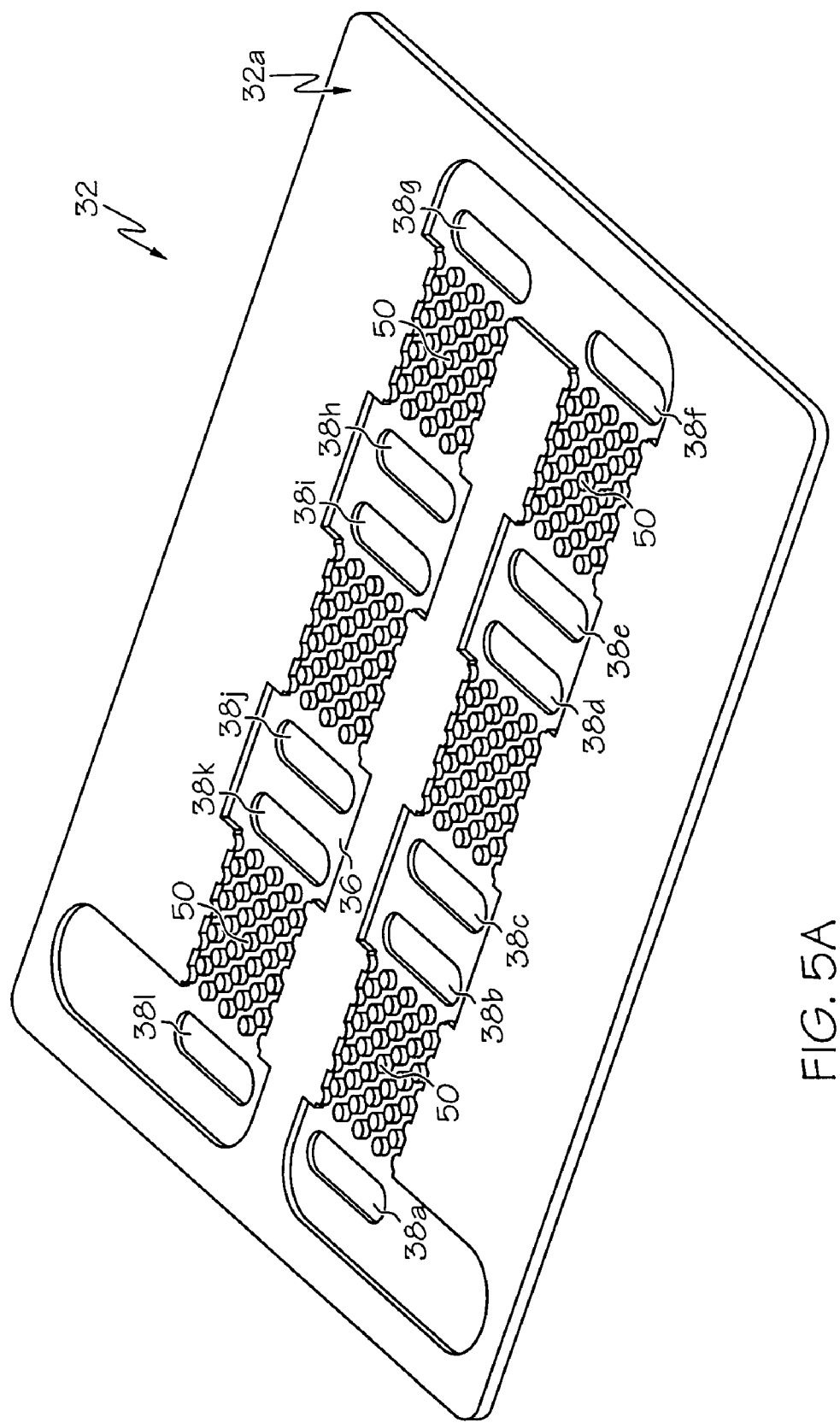
FIGS. 5A-5E depict a fabrication process for a base of the semiconductor power module of FIGS. 1-4.
Figure 5B:
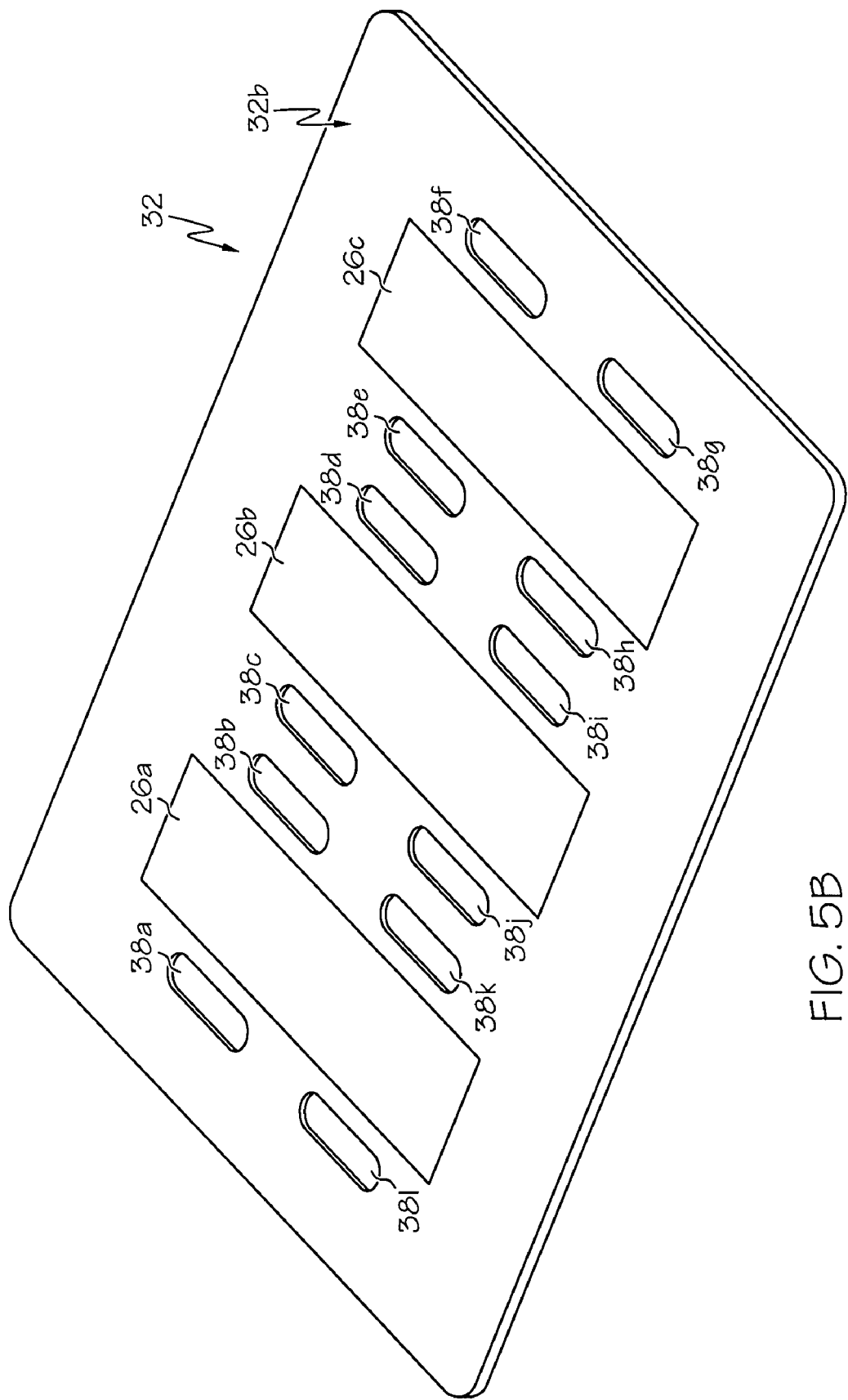
Figure 5C:
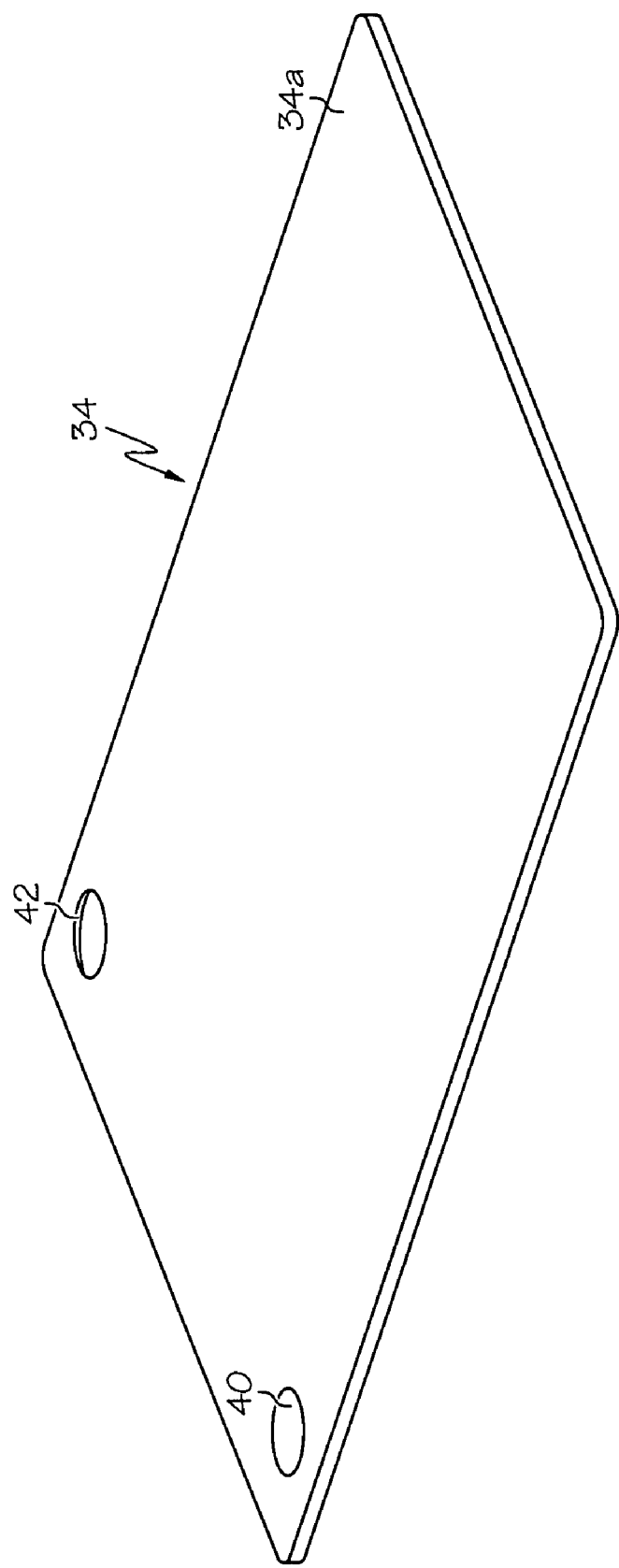
Figure 5D:
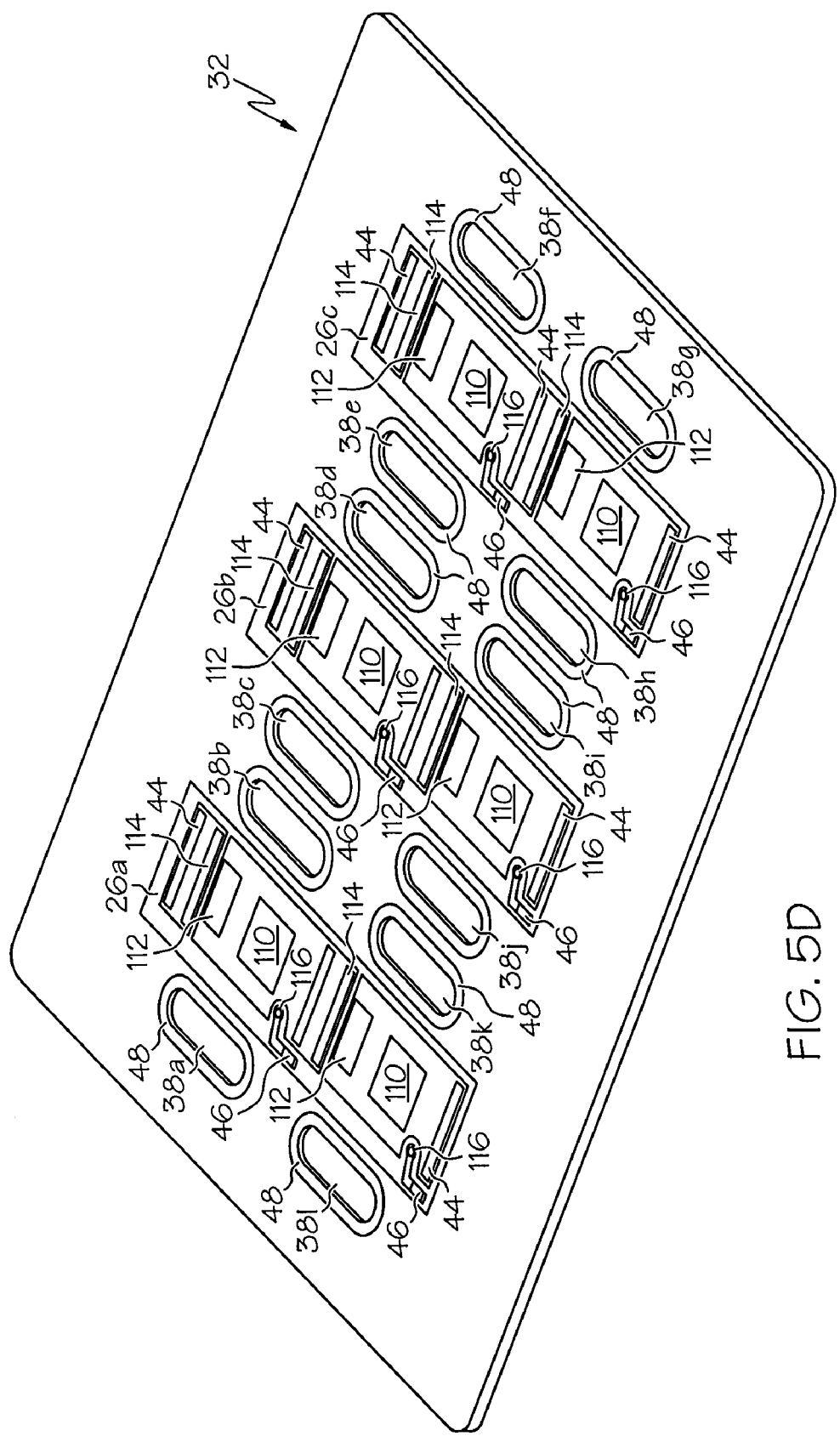
Figure 5E:
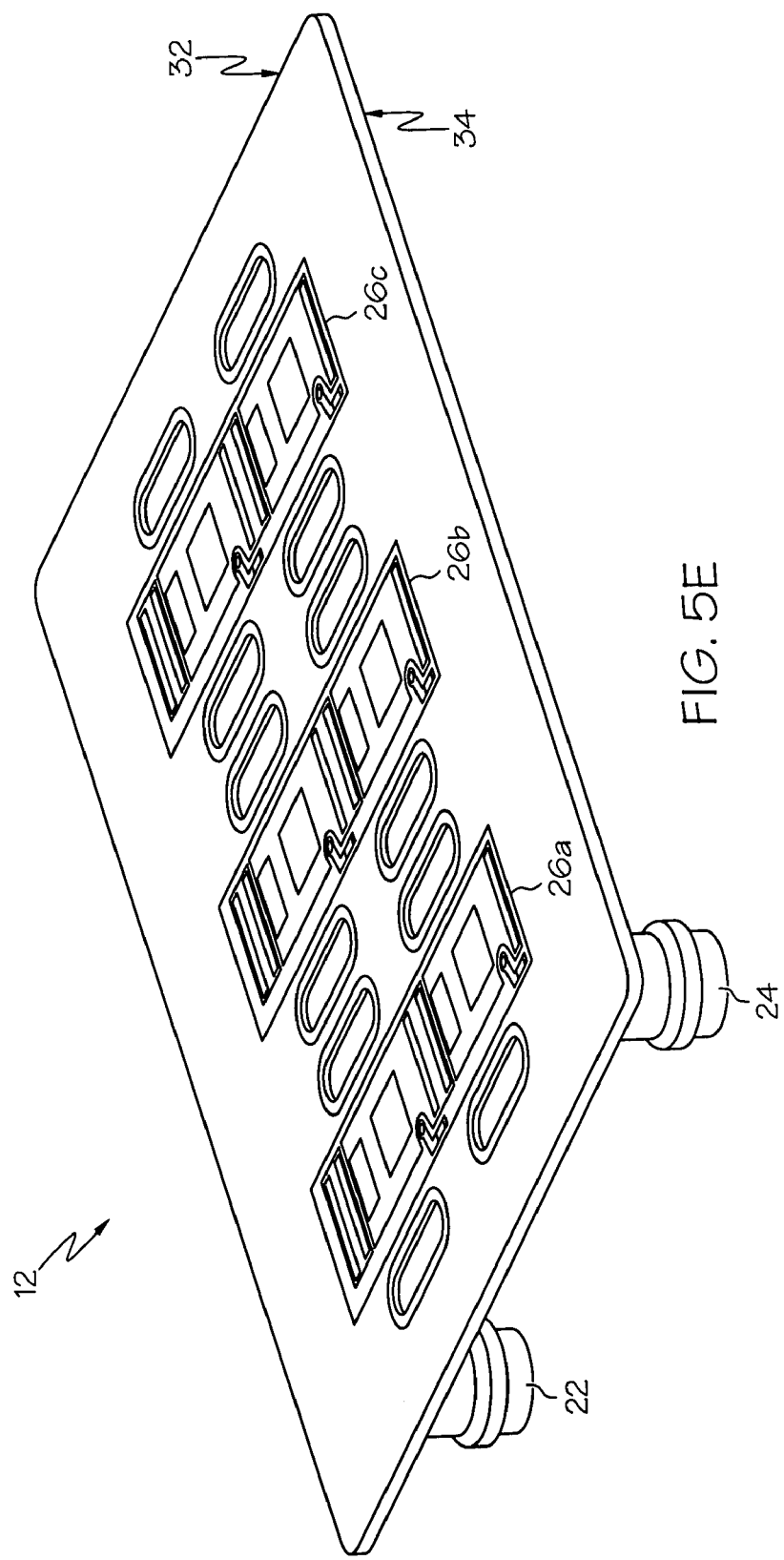

FIGS. 5A-5E depict a preferred construction of base 12, including the following elements: a backplate 32, a sheet metal panel 34, an inlet fluid coupling 22, an outlet fluid coupling 24, and three ceramic circuit boards 26a-26c. Referring to FIG. 5A, the backplate 32 has a U-shaped recess 36 in its outboard face 32a for defining the inboard surface of the fluid passage 20, and a number of openings 38a-38l for permitting fluid flow between the fluid passage 20 and the fluid passages 18 of covers 14a-14f. Referring to FIG. 5C, the metal panel 34 is fastened to the outboard face 32a of baseplate 32 and defines the outboard surface of the fluid passage 20. Inlet and outlet fluid couplings 22 and 24 are fastened to the outboard face 34a of panel 34 about a pair of panel openings 40 and 42 to facilitate coolant supply and exhaust for the fluid passage 20. Referring to FIGS. 5B and 5D, the ceramic substrates 26a-26c are attached to the inboard face 32b of backplate 32, and metalized areas are formed on the substrates 26a-26c for interfacing with the semiconductor chip assemblies 16, power terminals 28 and gate terminals 30. A non-wettable solder stop material is selectively applied to the metalized areas to form solderable regions and traces corresponding to the power terminals 28, the gate terminals 30, the collector and anode electrodes of semiconductor chips 70 and 72, and un-insulated regions of the flexible circuit leadframes 74. As indicated above, the power terminals 28 are soldered to the regions 44, and the gate terminals 30 are soldered to the regions 46. Also, a solderable ring 48 is formed around each of the openings 38a-38l so that each joint between base fluid passage 20 and a cover fluid passage 18 is sealed at its perimeter with solder. The completed base 12 is depicted in FIG. 5E.

In a preferred construction of base 12, the backplate 32 is green-cast molded with Aluminum Silicon Carbide (AlSiC), and backplate 32 and ceramic substrates 26a-26c are co-fired. The fired assembly is then infused with molten Aluminum, and the metal skin thereby created is selectively etched away to form the circuit paths on ceramic substrates 26a-26c. The metal panel 34 is fastened to backplate 32 by brazing, as are the inlet and outlet couplings 22, 24 to the metal panel 34.

Figure 4:
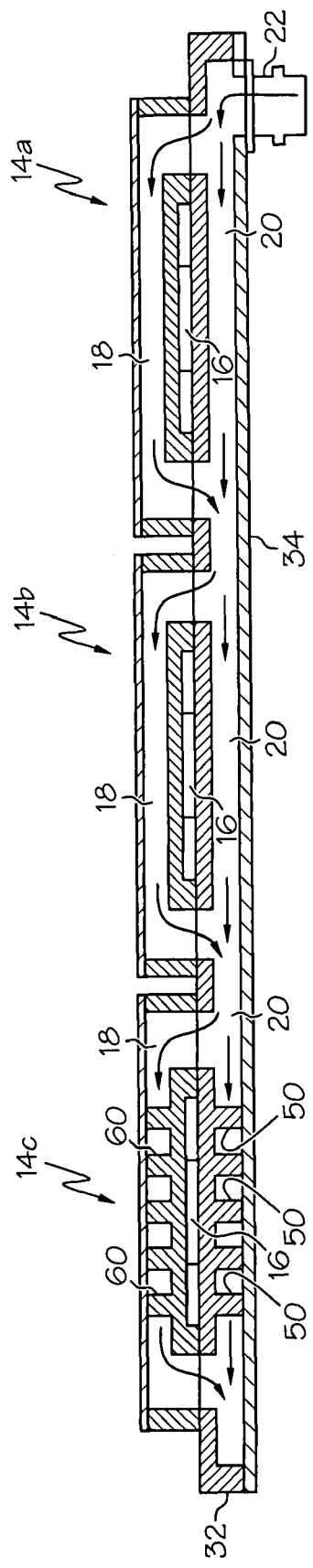
FIG. 4 is a simplified cross-sectional view of the semiconductor power module of FIGS. 1-3 illustrating a flow of coolant fluid through the module.

An important aspect of the base 12 is the formation of an array of posts 50 within the fluid passage 20 for enhancing the effective surface area for heat dissipation. Referring to FIGS. 4 and 5A, this is conveniently achieved by molding the posts 50 into the recess 36 of backplate 32 in the regions between openings 38a-38l. Alternately, a metal fin structure can be brazed into the recess 36, similar to the arrangement described in U.S. Pat. No. 6,639,798 to Jeter et al., incorporated by reference herein.

Figure 6A:
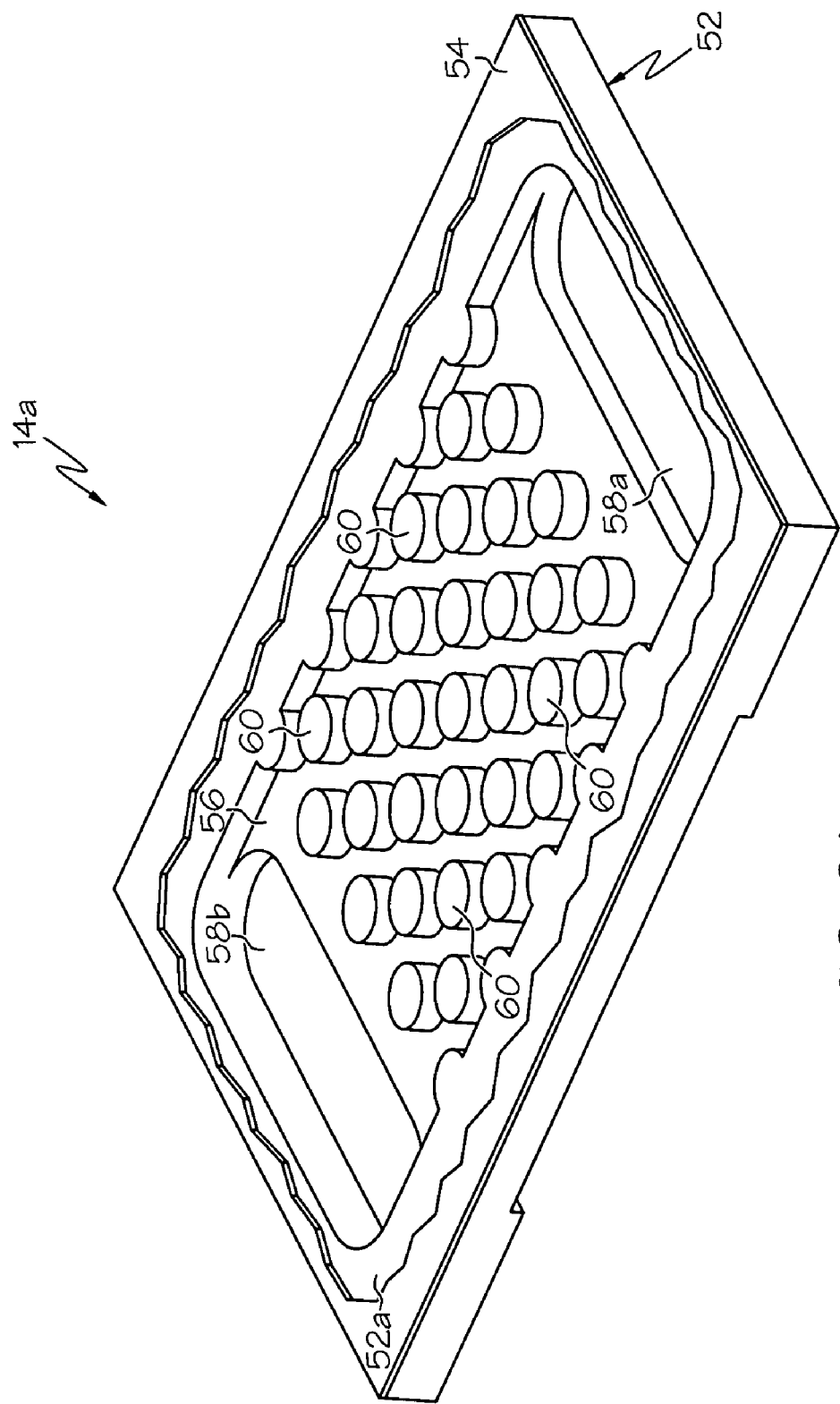
FIGS. 6A-6B depict a fabrication process for a cover of the semiconductor power module of FIGS. 1-4.
Figure 6B:
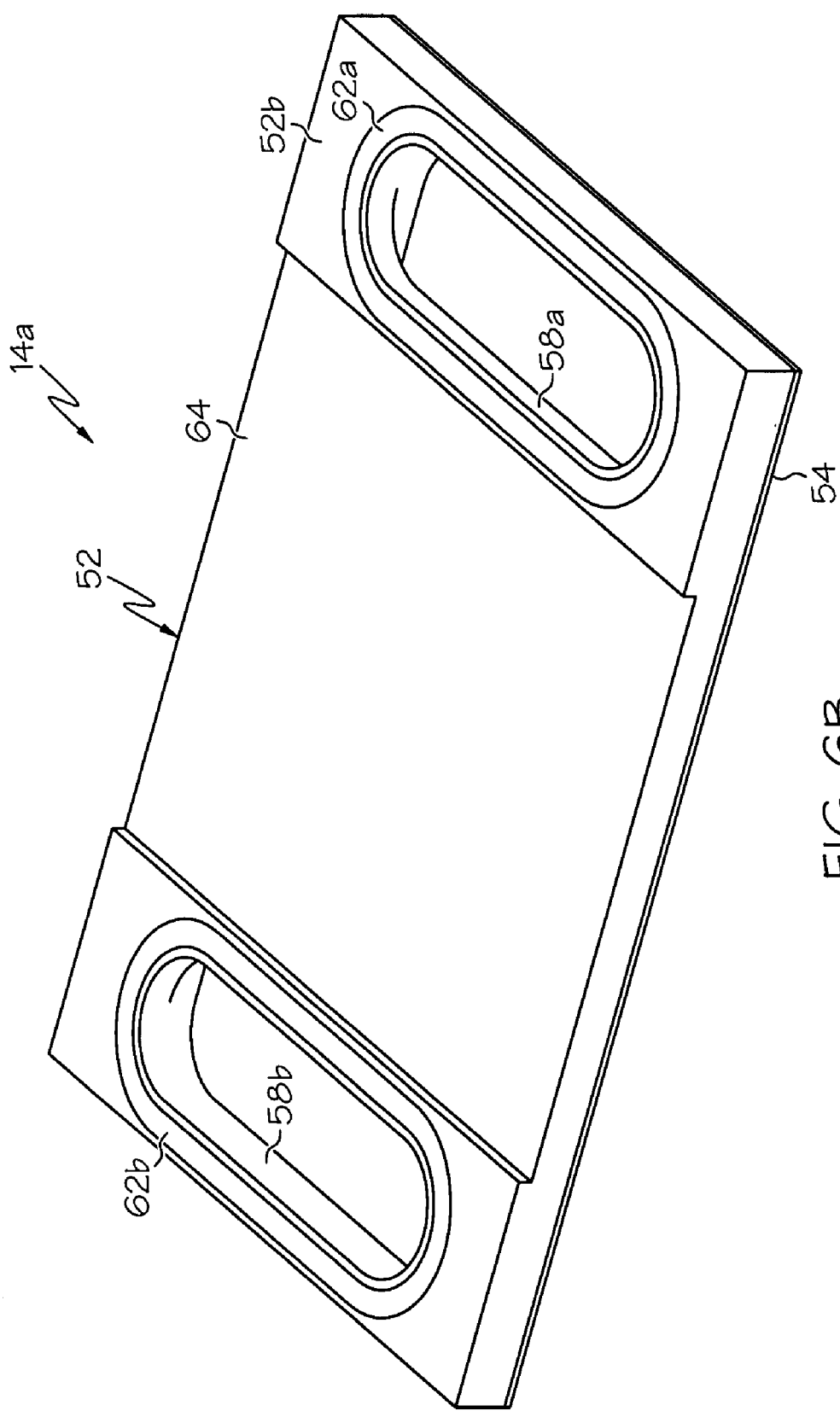

FIGS. 6A-6B illustrate a preferred construction of the covers 14a-14f similar to that of the base 12. The covers 14a-14f are identical as mentioned above, and FIGS. 6A-6B illustrate a representative fully constructed cover 14a. Referring to FIG. 6A, the cover 14a includes a recessed coverplate 52 and a sheet metal panel 54. Referring to FIG. 6A, a recess 56 is formed in the outboard face 52a of coverplate 52 for defining the inboard surface of the fluid passage 18, and the panel 54 defines the outboard surface of the fluid passage 18. Openings 58a and 58b are provided in opposite ends of the coverplates 52 permitting fluid flow between the fluid passage 18 and the fluid passage 20 of base 12. As with the backplate 32 of base 12, the coverplate 52 is preferably fabricated to include integral posts 60 in the fluid passage 18 for enhancing the effective cooling surface area. As seen in FIG. 6B, the inboard face 52b of coverplate 52 includes a solderable ring 62a, 62b around each of the openings 58a, 58b so that each joint between base fluid passage 20 and a cover fluid passage 18 is sealed at its perimeter with solder. Also, the inboard face 52b of coverplate 52 is recessed in a central region 64 between the openings 58a, 58b to accommodate the height or thickness dimension of the semiconductor chip assemblies 16. In a preferred construction of cover 14a, the coverplate 52 is green-cast molded with Aluminum Silicon Carbide (AlSiC), fired and infused with molten Aluminum.

Figure 7:
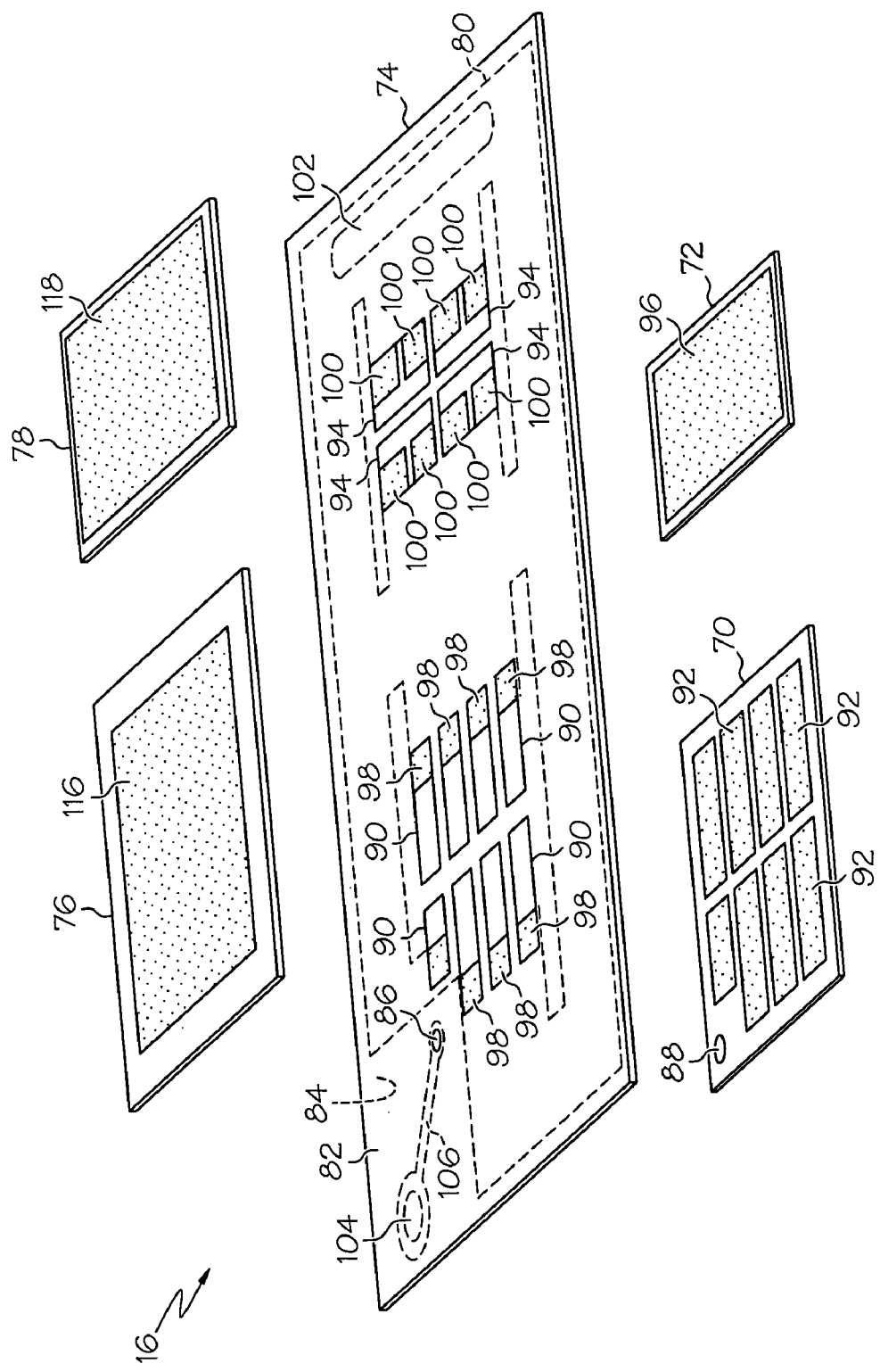
FIG. 7 is an exploded isometric view of a semiconductor chip assembly for the semiconductor power module of FIGS. 1-4.

As mentioned above in reference to FIGS. 1-4, the semiconductor chip assemblies 16 are placed on the circuit traces formed on the ceramic substrates 26a-26c of base 12. Referring to FIG. 7, the flexible circuit leadframe 74 of each semiconductor chip assembly 16 comprises a patterned copper layer 80 (shown in phantom) whose upper and lower surfaces are mostly insulated by upper and lower insulation layers 82 and 84. The insulation layers 82 and 84 are patterned to provide: (1) an un-insulated region 86 that corresponds and registers with the gate electrode 88 of transistor chip 70, (2) an array of un-insulated regions 90 that correspond and register with the emitter electrodes 92 of transistor chip 70; and (3) an array of un-insulated regions 94 that correspond and register with the anode electrode 96 of diode chip 72. Exposed leadframe copper in the region 86 is soldered to the gate electrode 88; exposed leadframe copper fingers 98 in the regions 90 are soldered to the emitter electrodes 92; and exposed leadframe copper fingers 100 in the regions 94 are soldered to the anode electrode 96. Additionally, the lower insulation layer 84 is patterned to expose a first un-insulated copper region 102 that is electrically tied to the emitter and anode electrodes 92, 96 via the insulated copper layer 80 and the un-insulated copper fingers 98, 100; and a second un-insulated copper region 104 that is electrically tied to the gate electrode 88 via an insulated copper leg 106 and the un-insulated copper in region 86.

Referring particularly to FIGS. 2, 5D and 7, each semiconductor chip assembly 16 is soldered to a respective ceramic circuit of base 12 in four places. When a semiconductor chip assembly 16 is placed on the ceramic circuit, the collector and cathode electrodes (not shown) of semiconductor chips 70 and 72 register with the solderable regions 110 and 112, which are electrically coupled to a respective region 44 and power terminal 28. At the same time, the exposed leadframe copper region 102 (i.e., the transistor emitter electrode) registers with the solderable region 114, which is electrically coupled to a respective region 44 and power terminal 28 (and in some cases to the collector electrode of another semiconductor chip assembly 16). And the exposed leadframe copper region 104 (i.e., the transistor gate electrode) registers with the solderable region 116, which is electrically coupled to a respective region 46 and gate terminal 30. Thus, the collector and cathode electrodes of the assembly 16 are directly coupled to the ceramic circuit, while the emitter, anode and gate electrodes of the assembly 16 are coupled to the ceramic circuit through the flexible circuit leadframe 74.

Heat dissipated by the chips 70, 72 of each semiconductor chip assembly 16 is dissipated downward into the base 12 through the lower ceramic substrates 26a-26c, and upward into the covers 14a-14f through the upper ceramic substrates 76 and 78. The downward heat dissipation is enhanced by the large solder joints between the collector and cathode electrodes of chips 70, 72 and the metalized regions 110, 112 formed on ceramic substrates 26a-26c. And the upward heat dissipation is enhanced by soldering the emitter and anode electrodes 92, 96 and the copper fingers 98, 100 of leadframe metal layer 80 to metalized regions (not shown) formed on the inboard (lower) surfaces of ceramic substrates 76 and 78. Furthermore, outboard surfaces of the ceramic substrates 76 and 78 have a metal cladding 116, 118 (such as copper, aluminum, or any conventional thick film or thin film conductor formulation) that is soldered to the central inboard surface 64 of a respective cover 14a-14f.

Figure 8:
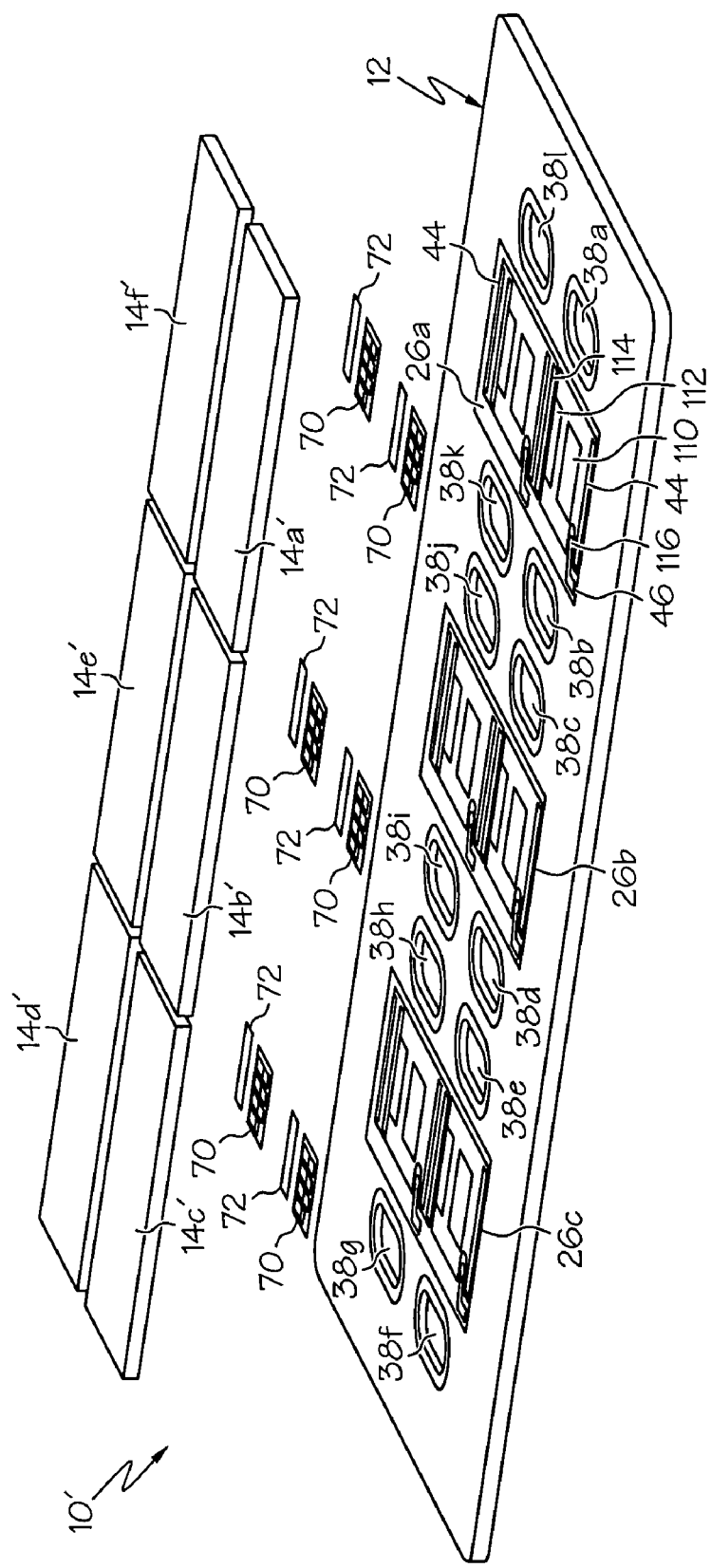
FIG. 8 is an exploded upper isometric view of a semiconductor power module according to a second embodiment of this invention.

FIGS. 8-9 illustrate an alternate semiconductor power module 10' in which the semiconductor chips 70, 72 are individually placed on the solderable regions 110 and 112 of the base ceramic substrates 26a, 26b, 26c; and ceramic substrates 120a, 120b, 120c, 120d, 120e, 120f formed on the central inboard faces of covers 14a', 14b', 14c', 14d', 14e', 14f' perform the function of the ceramic substrates 76, 78 and the leadframe metal layer 80 of the first embodiment. Each transistor gate electrode 88 is soldered to a circuit trace 122a, 122b, 122c, 122d, 122e, 122f formed on a respective cover substrate 120a-120f, and that circuit trace is also soldered to a respective circuit trace 116 of base 12. A different circuit trace 124a, 124b, 124c, 124d, 124e, 124f on the respective cover substrate 120a-120f is soldered to the transistor emitter and diode cathode electrodes 92, 96, and to a respective circuit trace 114 of base 12. The covers 14a'-14f' may be manufactured in the same way as the base 12, as described above in reference to FIGS. 5A-5E.

In summary, the present invention provides an improved semiconductor power module with double-side cooling and optimal thermal coupling between the semiconductor devices 70, 72 and the coolant. Even the power and gate terminals 28, 30 are thermally coupled to the module.

While the present invention has been described in reference to the illustrated embodiment, it will be understood that numerous modifications and variations in addition to those mentioned above will occur to those skilled in the art. For example, the disclosed apparatus is applicable to modules housing a different number of chips, a different number of covers, etc. Also, the base and covers may be manufactured with any thermally suitable material, such as sintered copper, that allows the integration of ceramic substrates, and in the case of the first embodiment, soldered attachment of the semiconductor assemblies to the cover. Accordingly, it is intended that the invention not be limited to the disclosed embodiment, but that it have the full scope permitted by the language of the following claims.

The invention claimed is:

1. A semiconductor power module, comprising:

a base having an internal coolant passage bounded in part by a thermally conductive baseplate, first and second fluid ports formed in said baseplate, and a first ceramic circuit board formed on said baseplate between said first and second ports;

a semiconductor chip thermally and electrically coupled to said first ceramic circuit board; and a cover including a thermally conductive coverplate mounted on said base and thermally coupled to said semiconductor chip, third and fourth fluid ports formed in said coverplate aligned with and joined to the first and second fluid ports of said baseplate, and an internal coolant passage coupling said third and fourth fluid ports such that coolant supplied to the coolant passage of said base diverges into parallel flow paths through the coolant passages of said base and said cover, and then converges in the coolant passage of said base, wherein said semiconductor chip includes a first surface on which is formed a first electrode, the first surface being soldered to the first ceramic circuit board of said base to electrically couple said first electrode to said first ceramic circuit board and to thermally couple said semiconductor chip to said baseplate, and wherein said semiconductor chip includes a second surface opposite said first surface on which is formed a second electrode, and said semiconductor power module further includes a leadframe electrically coupling said second electrode to said first ceramic circuit board and a second ceramic circuit board for thermally coupling said semiconductor chip to said cover, and wherein said leadframe is a flexible circuit including an insulated conductor layer having a first un-insulated region soldered to said second electrode and a second un-insulated region soldered to said first ceramic circuit board.

2. A semiconductor power module, comprising:

a base defining an internal coolant passage bounded in part by a thermally conductive baseplate, said base further defining a first and a second fluid port formed in said base, and the first and the second fluid port being in fluid communication with the internal coolant passage of the base, and a first ceramic circuit board disposed on said base between said first and said second port;

a semiconductor chip thermally and electrically coupled to said first ceramic circuit board, said semiconductor chip including a first electrode formed on a first surface of the semiconductor chip and a second electrode formed on a second surface opposite the first surface on the semiconductor chip;

a cover including a thermally conductive coverplate, said cover mounted on said base and thermally coupled to said semiconductor chip, the cover defining a third and a fourth fluid port being aligned with and joined to the respective first and the second fluid port of said base, and the cover further defining an internal coolant passage in fluid communication with said third and said fourth fluid port such that coolant supplied to the coolant passage of said base diverges into parallel flow paths through the coolant passages of said base and said cover, and then converges in the coolant passage of said base;

a leadframe electrically coupling the second electrode to said first ceramic circuit board; and a ceramic substrate for thermally coupling said semiconductor chip to said coverplate, wherein the first surface is soldered to the first ceramic circuit board on said base to electrically couple said first electrode to said first ceramic circuit board and to thermally couple said semiconductor chip to said base, and said leadframe is a flexible circuit including an insulated conductor layer having a first un-insulated region soldered to said second electrode and a second un-insulated region soldered to said first ceramic circuit board.

3. The semiconductor power module of claim 1, further comprising a terminal mounted on the first ceramic circuit board of said base adjacent said cover for electrically accessing said semiconductor chip.

4. The semiconductor power module of claim 1, wherein said baseplate includes an array of posts extending into the coolant passage of said base to enhance an effective thermal surface area of said base.

5. The semiconductor power module of claim 1, wherein said coverplate includes an array of posts extending into the coolant passage of said cover to enhance an effective thermal surface area of said cover.

6. The semiconductor power module of claim 1, wherein said semiconductor chip includes a first surface on which is formed a first electrode, the first surface being soldered to the first ceramic circuit board of said base to electrically couple said first electrode to said first ceramic circuit board and to thermally couple said semiconductor chip to said baseplate.

7. The semiconductor power module of claim 6, wherein said semiconductor chip includes a second surface opposite said first surface on which is formed a second electrode, and said semiconductor power module further including a leadframe electrically coupling said second electrode to said first ceramic circuit board and a ceramic substrate for thermally coupling said semiconductor chip to said cover.

8. The semiconductor power module of claim 7, wherein the second surface of said semiconductor chip is soldered to the leadframe and the ceramic substrate to electrically couple the second electrode to said first ceramic circuit board and thermally couple said semiconductor chip to said coverplate.

9. The semiconductor power module of claim 8, wherein said ceramic substrate includes a conductive layer soldered to said coverplate to thermally couple said semiconductor chip to said coverplate.

10. The semiconductor power module of claim 6, wherein said semiconductor chip includes a second surface opposite said first surface on which is formed a second electrode, and wherein said cover includes a ceramic substrate formed on said coverplate between said third and fourth fluid ports, the second surface of said semiconductor chip being soldered to the ceramic substrate of said cover to thermally couple said semiconductor chip to said cover.

11. The semiconductor power module of claim 10, wherein said ceramic substrate is electrically coupled to said first ceramic circuit board to electrically couple the second electrode of said semiconductor chip to said first ceramic circuit board.

12. The semiconductor power module of claim 1, wherein the internal coolant passage of said base is bounded in part by a metal panel that is affixed to said baseplate, a fluid inlet affixed to said panel for supplying coolant to said passage upstream of said fluid ports, and a fluid outlet affixed to said panel for draining coolant from said passage downstream of said fluid ports.

13. The semiconductor power module of claim 1, wherein a plurality of covers are mounted on said base, each such cover being thermally coupled to a respective semiconductor chip, and each having an internal passage that is joined to the internal passage of said base so that the coolant supplied to the base successively diverges and converges in parallel flow paths through the base and the covers.

14. The semiconductor power module of claim 1, wherein at least one of the baseplate and the coverplate being formed from a material including Aluminum Silicon Carbide (Al-SiC).

* * * * *